(12) United States Patent
Pan

(10) Patent No.: US 7,869,285 B2
(45) Date of Patent: Jan. 11, 2011

(54) LOW VOLTAGE OPERATION BIAS CURRENT GENERATION CIRCUIT

(75) Inventor: Dong Pan, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 402 days.

(21) Appl. No.: 12/037,649

(22) Filed: Feb. 26, 2008

(65) Prior Publication Data

US 2009/0213666 A1 Aug. 27, 2009

(51) Int. Cl.
*G11C 5/14* (2006.01)

(52) U.S. Cl. ............. 365/189.09; 365/100; 365/210.12; 365/148

(58) Field of Classification Search ............ 365/189.09, 365/100, 148, 210.12; 323/311–317; 327/530
See application file for complete search history.

(56) References Cited

U.S. PATENT DOCUMENTS

| | | | |
|---|---|---|---|
| 6,714,462 B2 | 3/2004 | Pan | |
| 6,847,560 B2 | 1/2005 | Pan | |
| 6,847,582 B2 | 1/2005 | Pan | |
| 7,098,724 B2 | 8/2006 | Pan | |
| 7,116,129 B2 | 10/2006 | Pan et al. | |
| 7,206,234 B2 | 4/2007 | Pan et al. | |
| 7,227,402 B2 | 6/2007 | Pan | |
| 7,256,643 B2 | 8/2007 | Pan et al. | |
| 7,262,637 B2 | 8/2007 | Pan et al. | |
| 2006/0152251 A1* | 7/2006 | Setterberg | ..................... 327/91 |
| 2009/0189694 A1* | 7/2009 | Davierwalla et al. | ......... 330/253 |

OTHER PUBLICATIONS

Sedra, A.S., and K. C. Smith, multiple chapters in Microelectronic Circuits, 4th Edition, Oxford University Press, 1998, pp. 402-412.

* cited by examiner

*Primary Examiner*—Thong Q Le
(74) *Attorney, Agent, or Firm*—Fletcher Yoder

(57) ABSTRACT

Devices and systems for generating a bias current with a low minimum voltage, for example, are disclosed. One such device includes a first transistor having a source coupled to a voltage supply, a drain coupled to a first node, and a gate coupled to a second node, a second transistor having a source coupled to a reference, and a drain and a gate coupled to the first node, a third transistor having a source coupled to the reference, a drain coupled to a third node, and a gate coupled to the first node, a first resistive element coupled between the voltage supply and the third node, a second resistive element coupled between the voltage supply and the second node, and a fourth transistor having a source coupled to the reference, a drain coupled to the second node, and a gate coupled to the third node.

23 Claims, 3 Drawing Sheets

LOW VOLTAGE OPERATION BIAS CURRENT GENERATION CIRCUIT

BACKGROUND OF THE INVENTION

1. Field of the Invention

The present invention relates generally to generating a bias current, and particularly in at least one embodiment to generating a bias current for low voltage operation of an analog or digital circuit.

2. Description of the Related Art

A bias current generation circuit represents a building block used in analog and digital circuits. Many circuit elements, such as operational amplifiers, employ a bias current originating from a bias current generation circuit. Circuit elements utilizing a bias current may be employed for a variety of purposes, including, for example, analog to digital conversion.

Circuits employing a bias current may benefit from a bias current that remains largely constant despite changes in voltage supply. A consistent bias current may allow a circuit to remain operative when power supply voltage is low, while preventing excessive power consumption when the power supply voltage is high.

As improved processes have begun to produce smaller integrated circuits, the nominal circuit operation voltage of integrated circuits has dropped in kind. Meanwhile, certain circuits may use an external power supply in normal operation, and thus the circuits may frequently employ thick oxide elements to improve reliability; thick oxide elements further tend to operate with a much higher threshold voltage than comparable counterparts of thinner oxide. Finally, because threshold voltage may increase greatly as ambient temperature decreases, minimal dependence on threshold voltage may be desirable.

Many conventional bias current generation circuits have been developed in attempts to address the above concerns. In one conventional form, a bias generation circuit may consist of a current mirror in which a single resistive element generates a bias current. The bias current generated by the circuit depends upon the voltage supplied and the value of the single resistor. While simple, variations in power supply voltage may cause the bias current being generated to vary correspondingly.

In another conventional form of bias current generation circuit, the circuit may generate a bias current largely independent of power supply voltage, but may include a relatively large number of elements in a path from the power supply voltage to ground. As a result, the minimum voltage required to generate a bias current in the described conventional circuit may include more than double the threshold voltage of a transistor.

Still other forms of conventional bias current generation circuits may attempt to address the above-stated concerns, but may employ additional start-up circuitry prior to operation. Such start-up circuitry may limit potential applications for which the bias current generation circuit may be used. Moreover, the circuit may also depend heavily upon the threshold voltage, making low-voltage operation difficult.

DETAILED DESCRIPTION OF SPECIFIC EMBODIMENTS

Figure 1:
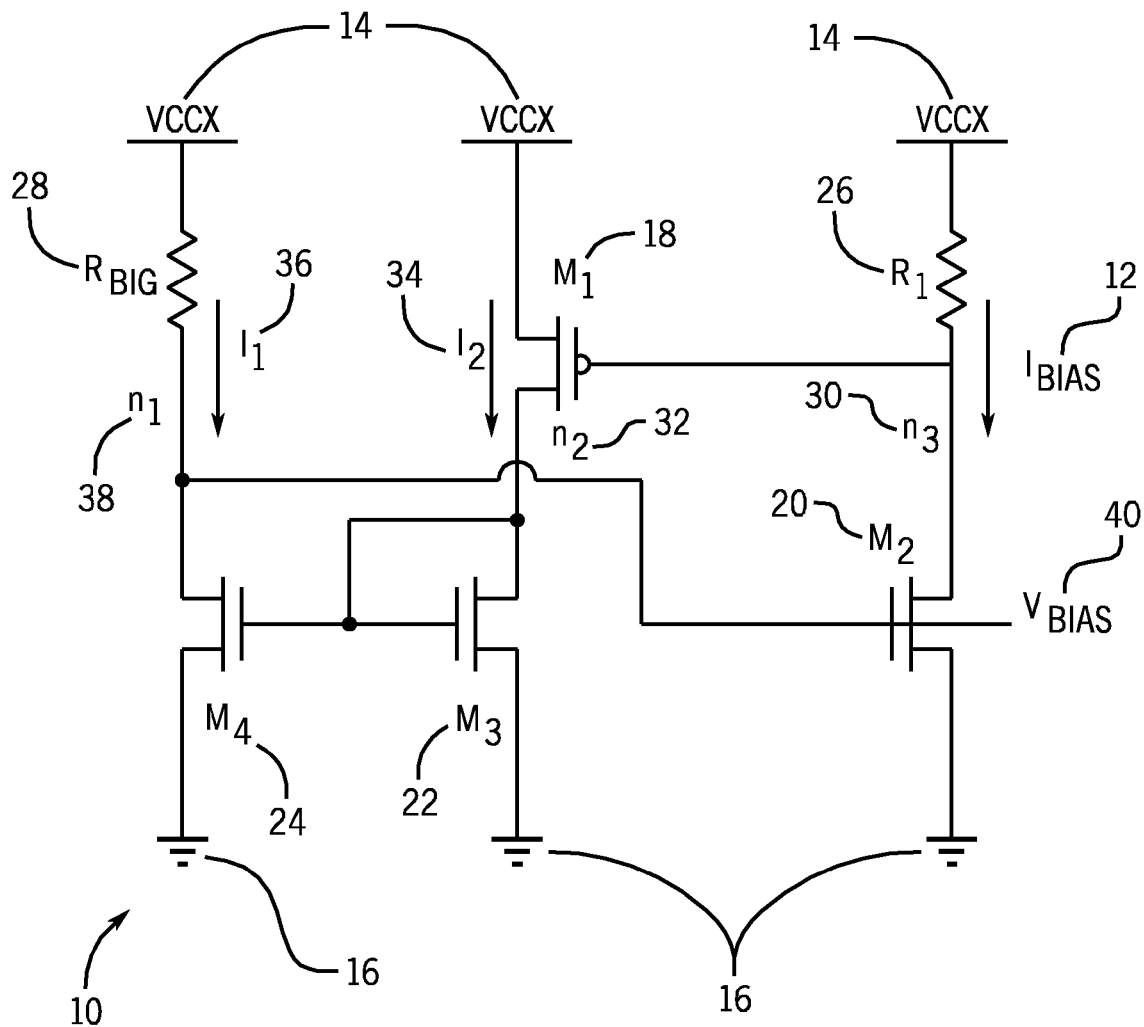
FIG. 1 is a schematic diagram of a bias current generation circuit in accordance with an embodiment of the present invention.

FIG. 1 illustrates a bias current generation circuit 10, which outputs a bias current Ibias 12. A voltage source VCCX 14 supplies a positive voltage difference relative to a reference 16, such as ground, to the bias current generation circuit 10. To output the bias current Ibias 12, the bias current generation circuit 10 may employ four metal oxide semiconductor field effect transistors ("MOSFETs") and two resistive elements, including PMOS transistor M1 18, NMOS transistors M2 20, M3 22 and M4 24, and resistors R1 26 and Rbig 28, to be described further below. One of ordinary skill in the art should appreciate, however, that the bias current generation circuit 10 may be alternatively inverted, so as to operate with a negative voltage difference, by reversing the locations and polarities of the elements of bias current generation circuit 10.

Referring initially to the PMOS transistor M1 18, the source is coupled to voltage supply VCCX 14, the gate is coupled to node N3 30, and the drain is coupled to node N2 32. A voltage Vgs between the gate and source of the transistor M1 18 may create an electrical field in the semi-conductive substrate below the gate of the transistor M1 18, resulting in what is known as an "induced channel." The induced channel effectively connects the source and drain regions of the transistor M1 18 together, such that a current may flow from the source to drain s of the transistor M1 18.

For a PMOS transistor, a negative voltage Vgs that is sufficient to cause the formation of an induced channel is known as a threshold voltage Vt. When the absolute value of voltage Vgs exceeds the absolute value of threshold voltage Vt, a reference current I2 34 may flow from the source to the drain s of transistor M1 18. When the absolute value of a negative voltage Vds across the drain and source s also exceeds the absolute value of Vgs−Vt, transistor M1 18 is said to be operating in the "saturation region." When the absolute value of the negative voltage Vds is greater than zero but less than the absolute value of Vgs−Vt, the reference current I2 34 may vary depending on Vds and transistor M1 18 is said to be operating in the "triode region."

NMOS transistors M2 20, M3 22, and M4 24 operate in a similar manner to that of PMOS transistor M1 18. However, because polarities are reversed from PMOS transistor M1 18, NMOS transistors M2 20, M3 22, and M4 24 operate when a positive, rather than negative, voltage Vgs exceeds a threshold voltage Vt. Similarly, NMOS transistors M2 20, M3 22, and M4 24 operate in the saturation region when a positive voltage Vds across drain and source s exceeds the value of Vgs−Vt. NMOS transistors M2 20, M3 22, and M4 24 operate in the triode region when a positive voltage Vds across drain and source s is greater than zero but less than the value of Vgs−Vt.

NMOS transistors M3 22 and M4 24 together form a current mirror. The gate of transistor M3 22 is tied to its own drain at node N2 32 and to the gate of transistor M4 24. The source s of both transistors M3 22 and M4 24 are coupled to reference 16. Accordingly, a voltage Vgs across the gate and source s of transistor M3 22 will equal a voltage Vgs across the gate and source s of transistor M4 24. Thus, if transistors M3 22 and M4 24 each have the same threshold voltage Vt, when transistor M3 22 becomes operational, transistor M4 24 may also become operational.

Because transistors M3 22 and M4 24 form a current mirror, the reference current I2 34 flowing through transistor M3 22 may be mirrored across transistor M4 24 as mirrored current I1 36 roughly according to a relationship between the ratios of channel width to channel length (W/L) of each device, $$I1 = \frac{(W/L)_{M4}}{(W/L)_{M3}} I2.$$

Accordingly, when channel width to length ratios of transistors M3 22 and M4 24 remain equal, mirrored current I1 36 may be roughly the same as reference current I2 34. The channel width to length ratios of transistors M3 22 and M4 24 may be of any appropriate value to achieve a desired mirrored current I1 36. For example, to cause mirrored current I1 36 to be roughly equal to reference current I2 34, both transistors M3 22 and M4 24 may share channel width to length ratios of 50/6. By way of comparison, NMOS transistor M2 20 may also have a channel width to length ratio of 50/6, while PMOS transistor M1 18 may have a channel width to length ratio of 100/5.

Mirrored current I1 36 flows across Rbig 28 into node N1 38 and across transistor M4 24, causing a voltage difference between voltage source VCCX 14 and node N1 38 to form across resistive element Rbig 28, which may have a resistance, for example, of approximately 1.3 MΩ. An increase in mirrored current I1 36 produces a corresponding increase in the voltage difference across resistive element Rbig 28. Since voltage source VCCX 14 generally remains constant, when mirrored current I1 36 increases, the voltage of node N1 38 decreases. It should be noted that if the voltage of node N1 38, which forms the voltage Vds of transistor M4 24, is less than Vgs–Vt, transistor M4 24 may operate in the triode region.

Continuing to refer to the bias current generation circuit 10 of FIG. 1, node N1 38 also represents a bias voltage Vbias 40, which is tied to the gate of transistor M2 20. When the bias voltage Vbias 40 exceeds the threshold voltage Vt of transistor M2 20, an induced channel may form in transistor M2 20. Consequently, the bias current Ibias 12 may flow through the drain region to the source region of transistor M2 20. Bias current Ibias 12 may vary depending upon resistive element R1 26 and the voltage of node n3 30. For stability, resistive element R1 26 may have a resistance of approximately half the resistance of Rbig 28, or approximately 540 kΩ. By coupling the output bias voltage Vbias 40 to the gate voltages of additional transistors, the bias current Ibias 12 may be replicated across the additional transistors.

As discussed above, node n3 30 is also coupled to the gate of transistor M1 18, thus effectively controlling the extent to which the reference current I2 34 may flow. The value of reference current I2 34 may affect the value of mirrored current I1 36, and the value of mirrored current I1 36, in turn, may affect the value of node n1 38 (and thus bias voltage Vbias 40). Since transistor M2 20 may be controlled largely by bias voltage Vbias 40, which may, in turn, affect the value of the bias current Ibias 12, the bias current generation circuit 10 is said to rely upon negative feedback. Accordingly, the stability of the circuit should be taken into consideration.

The bias current generation circuit 10 of FIG. 1 has two poles, one at the output bias voltage Vbias 40 (or node n1 38) and one at node n3. Since the resistance of resistive element Rbig 28 is greater than that of resistive element R1 26, the output resistance at bias voltage Vbias 40 is correspondingly greater than at node n3 30. Accordingly, the pole at bias voltage Vbias 40 dominates over the pole at node n3 30. Furthermore, in practice, the bias voltage Vbias 40 may connect to the gate s of many additional transistor devices to mirror the bias current Ibias 12, substantially increasing the capacitance at bias voltage Vbias 40. Higher capacitance thus results in a much lower pole frequency at bias voltage Vbias 40 relative to node n3 30, which further stabilizes the bias current generation circuit 10.

To determine the minimum operating voltage of the bias current generation circuit 10 of FIG. 1, the greatest minimum voltage difference from voltage source VCCX 14 to reference 16 should be considered. One minimum voltage difference across the bias current generation circuit 10 runs through transistor M1 18 and transistor M3 22, and includes an overdrive voltage dv of transistor M1 18, which represents a voltage drop across the source and drain regions of transistor M1 18, plus the voltage of node n2 32. The voltage of node n2 32, which also represents the voltage Vgs of transistor M3 22, equates to the threshold voltage Vt of transistor M3 22 plus the overdrive voltage dv of transistor M3 22.

Another minimum voltage difference across the bias current generation circuit 10 runs across the source and gate s of transistor M1 18 and across the drain and source s of transistor M2 20, represented by the Vgs of transistor M1 18 plus the overdrive voltage dv of transistor M2 20. The Vgs of transistor M1 18 is equal to the threshold voltage Vt of transistor M1 18 plus an overdrive voltage dv of transistor M1 18. Accordingly, the greatest minimum voltage difference, and thus the minimum operating voltage, of bias current generation circuit 10 may be represented by the equation, $VCCX_{min} \approx V_t + 2\,dv$.

It should be noted that values of threshold voltage Vt may vary considerably, depending on, for example, ambient temperature and whether the switching speed of the PMOS transistor M1 18 relatively fast or slow. Generally, however, threshold voltage Vt may equal approximately 0.6 V. Values of overdrive voltage dv may also vary, but generally may equal approximately 0.1 V. As such, the minimum operating voltage for voltage supply VCCX 14 may generally equal approximately 0.8V. However, as threshold voltage Vt and overdrive voltage dv may vary, the minimum operating voltage for the bias current generation circuit 10 may consequently vary.

Figure 2:
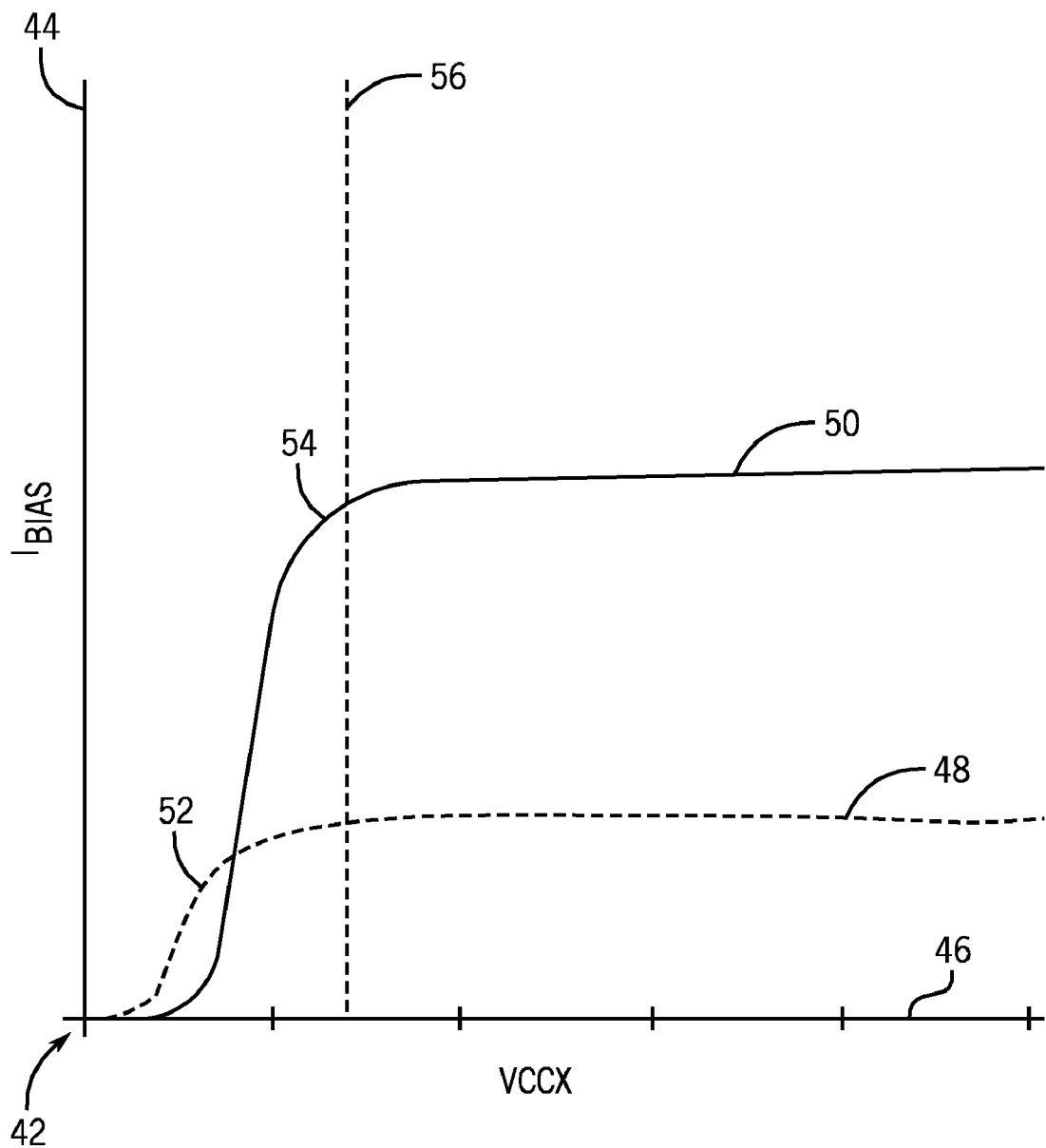
FIG. 2 is a chart depicting the relationship between bias current and power supply voltage VCCX in the bias current generation circuit of FIG. 1.

Turning to FIG. 2, plot 42 represents the bias current Ibias 12 output by the bias current generation circuit 10 as values of voltage supply VCCX 14 vary. Ordinate 44 represents relative values of the bias current Ibias 12 generated by the bias current generation circuit 10, while abscissa 46 represents relative values of voltage supplied by the voltage supply VCCX 14. Curve 48, a dashed line, represents the bias current Ibias 12 output by the bias current generation circuit 10 when PMOS transistor M1 18 has relatively fast characteristics. In contrast, curve 50, a solid line, represents the bias current Ibias 12 output by the bias current generation circuit 10 when PMOS transistor M1 18 has relatively slow characteristics.

An inflection point 52 on curve 48 represents a minimum value of voltage supply VCCX 14 for producing an approximately constant bias current Ibias 12 when transistor M1 18 has relatively fast characteristics. Similarly, an inflection point 54 on curve 50 represents a minimum value of voltage supply VCCX 14 for producing an approximately constant bias current Ibias 12 when transistor M1 18 has relatively slow characteristics. Because a relatively faster PMOS transistor M1 18 may have a lower threshold voltage Vt, Ibias 12 approaches approximate constancy more quickly. However, a relatively slower PMOS transistor M1 18 may produce higher values of Ibias 12.

Threshold line 56 represents a minimum voltage for VCCX 14 at which the bias current generation circuit 10 may output an approximately constant bias current Ibias 12, without regard as to whether transistor M1 18 has fast or relatively slow characteristics. Beyond threshold line 56, curves 48 and 50 both remain approximately constant as VCCX 14 increases and vary less than 10 percent per volt.

Figure 3:
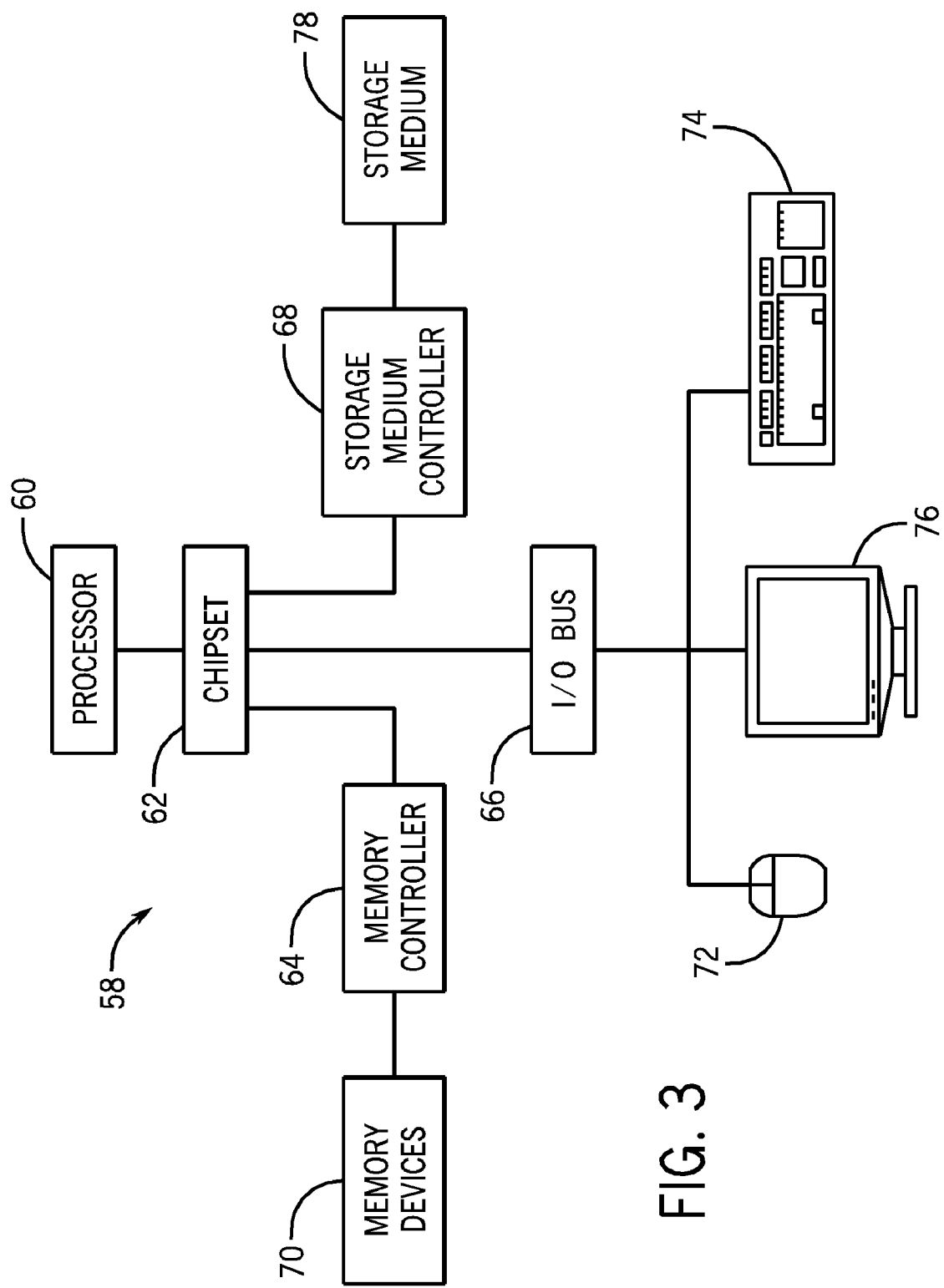
FIG. 3 is a block diagram of a system employing the bias current generation circuit of FIG. 1 in accordance with an embodiment of the present invention.

FIG. 3 illustrates a system 58 employing a bias current generation circuit 10, which may form, for example, a desktop computer, a notebook computer, a server, a handheld computer, or a portable device, such as a portable phone or media player. The system 58 may include one or more processors, such as central processing units ("CPUs") 60. The CPU 60 may be used individually or in combination with other CPUs. In one embodiment of the invention, CPU 60 may include the bias current generation circuit 10.

A chipset 62 may be operably coupled to CPU 60. Chipset 62 operates as a communication pathway for signals between CPU 60 and other components of the system 58 including, for example, memory controller 64, an input/output bus 66, and a storage medium controller 68. As should be appreciated by those skilled in the art, memory controller 64, input/output bus 66, and storage medium controller 68 may alternatively be incorporated into chip set 62.

Memory devices 70, operably coupled to memory controller 64, may also include a bias current generation circuit 10. Memory devices 70 may represent volatile memory, such as synchronous dynamic random access memory (SDRAM), but may also represent non-volatile memory such as Flash memory. Input/output bus 66 may permit chipset 62 to communicate with a pointing input device 72, such as a mouse, a keyboard input device, such as a keyboard 74, and a display device 76. Pointing input device 72 and keyboard input device 74 may alternatively be incorporated into the display 76.

Storage medium controller 68 may be operably coupled to chip set 62, permitting communication between chip set 62 and a non-volatile storage medium 78, such as an internal disk drive or non-volatile memory, such as Flash memory. Accordingly, storage medium 78 may also include bias current generation circuit 10 as to provide a bias current to any analog circuitry making use of a bias current.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device comprising:
a first transistor having a source coupled to a voltage supply, a drain coupled to a first node, and a gate coupled to a second node;
a second transistor having a source coupled to a reference, and a drain and a gate coupled to the first node;
a third transistor having a source coupled to the reference, a drain coupled to a third node, and a gate coupled to the first node;
a first resistive element coupled between the voltage supply and the third node;
a second resistive element coupled between the voltage supply and the second node; and
a fourth transistor having a source coupled to the reference, a drain coupled to the second node, and a gate coupled to the third node.

2. The device of claim 1, wherein the first resistive element has a greater resistance than the second resistive element.

3. The device of claim 2, wherein the first resistive element has a resistance of approximately double the second resistive element.

4. The device of claim 3, wherein the first resistive element has a resistance of approximately 1.3 MΩ and the second resistive element has a resistance of approximately 540 kΩ.

5. The device of claim 1, wherein width by length ratios of each of the second transistor, third transistor, and fourth transistor are substantially equal.

6. The device of claim 5, wherein a width by length ratio of the first transistor is approximately double the width by length ratios of the second transistor, third transistor, and fourth transistor.

7. The device of claim 6, wherein the width by length ratio of the first transistor is approximately 100/5 and the width by length ratios of the second transistor, third transistor, and fourth transistor are approximately 50/6.

8. The device of claim 1, wherein the second transistor, the third transistor, and the fourth transistor are NMOS transistors and the first transistor is a PMOS transistor.

9. The device of claim 7, wherein a width by length ratio of the first transistor is approximately double the width by length ratios of the second transistor, third transistor, and fourth transistor.

10. The device of claim 1, wherein the device comprises an operational amplifier.

11. A method of generating a bias current comprising:
supplying a voltage difference to a bias current generation circuit, wherein the bias current generation circuit is configured to operate as long as the voltage difference equals at least a threshold voltage plus two overdrive voltages of a transistor in the bias generation circuit, wherein supplying the voltage difference to the bias current generation circuit comprises supplying the voltage difference to the bias current generation circuit, the bias current generation circuit being stabilized through negative feedback; and
generating a bias current with the bias current generation circuit, wherein the bias current is capable of remaining approximately constant despite variations in the voltage difference.

12. The method of claim 11, wherein supplying the voltage difference to the bias current generation circuit comprises supplying the voltage difference to the bias current generation circuit, the bias current generation circuit being configured to operate without a startup circuit.

13. A device comprising:
a bias current generation circuit configured to generate a bias current when a voltage difference across the bias current generation circuit is equal to or greater than an overdrive voltage plus a threshold voltage of a transistor of the bias current generation circuit, wherein the bias current generation circuit is configured to generate a bias current capable of remaining approximately constant despite changes in the voltage difference across the bias current generation circuit, and wherein the bias current generation circuit is configured to be stabilized through negative feedback.

14. The device of claim 13, wherein the bias current generation circuit comprises three transistors in parallel, a source of each of the three transistors being coupled to a reference.

15. The device of claim 14, wherein a first and a second transistor of the three transistors form a current minor and a third transistor of the three transistors is configured to permit the bias current to flow through a drain to a source of the third transistor when third transistor is activated.

16. A system comprising:
a processor; and
a memory device operably coupled to the processor, the memory device comprising a bias current generation circuit configured to generate a bias current when a voltage difference across the bias current generation circuit is equal to or greater than an overdrive voltage plus a threshold voltage of a transistor of the bias current generation circuit, wherein the bias current generation circuit is configured to generate a bias current capable of remaining approximately constant despite changes in the voltage difference across the bias current generation circuit, and wherein the bias current generation circuit is configured to be stabilized through negative feedback.

17. The system of claim 16, wherein the memory device comprises a synchronous dynamic random access memory (SDRAM) device.

18. The system of claim 16, wherein the memory device comprises an operational amplifier and the operational amplifier comprises the bias current generation circuit.

19. The system of claim 16, wherein the memory device comprises a flash memory device.

20. A device comprising:
a current minor comprising a first transistor and a second transistor, wherein the current mirror is configured to mirror a reference current from across the first transistor to across the second transistor;
a first resistive element coupled in series to a drain of the second transistor;
a third transistor coupled in series to a drain of the first transistor, wherein the third transistor is configured to control the first reference current based on a voltage applied to a gate of the third transistor;
a fourth transistor configured to permit a bias current to flow through a drain to a source of the fourth transistor based on a voltage applied to a gate of the fourth transistor, wherein the gate of the fourth transistor is coupled to the drain of the second transistor and wherein a drain of the fourth transistor is coupled to the gate of the third transistor; and
a second resistive element coupled in series to the drain of the fourth transistor.

21. The device of claim 20, comprising a voltage source coupled to the first resistive element, the second resistive element, and a source of the third transistor.

22. The device of claim 20, comprising a reference coupled to a source of the first transistor, a source of the second transistor, and a source of the fourth transistor.

23. A method of generating a bias current comprising:
supplying a voltage difference to a bias current generation circuit, wherein the bias current generation circuit is configured to operate as long as the voltage difference equals at least a threshold voltage plus two overdrive voltages of a transistor in the bias generation circuit; and
generating a bias current with the bias current generation circuit, wherein the bias current is capable of remaining approximately constant despite variations in the voltage difference, wherein generating the bias current with the bias current generation circuit comprises generating a current, such that the current is relatively higher if a switching speed of transistors of the bias current generation circuit is relatively slow and such that the current is relatively lower if the switching speed of transistors of the bias current generation circuit is relatively fast.

* * * * *

UNITED STATES PATENT AND TRADEMARK OFFICE
CERTIFICATE OF CORRECTION

PATENT NO. : 7,869,285 B2  Page 1 of 1
APPLICATION NO. : 12/037649
DATED : January 11, 2011
INVENTOR(S) : Dong Pan It is certified that error appears in the above-identified patent and that said Letters Patent is hereby corrected as shown below:

In the Claims:

In column 7, line 2, in Claim 15, delete "minor" and insert -- mirror --, therefor.

In column 7, line 29, in Claim 20, delete "minor" and insert -- mirror --, therefor.

Signed and Sealed this
Fifteenth Day of March, 2011

David J. Kappos
*Director of the United States Patent and Trademark Office*